United States Patent [19]
West et al.

[11] Patent Number: 5,942,372
[45] Date of Patent: *Aug. 24, 1999

[54] SENSITIZED PHOTOPOLYMERIZABLE COMPOSITIONS AND USE THEREOF IN LITHOGRAPHIC PRINTING PLATES

[75] Inventors: Paul Richard West, Fort Collins; Jeffery Allen Gurney, Gurney, both of Colo.

[73] Assignee: Kodak Polychrome Graphics, LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/752,342

[22] Filed: Nov. 19, 1996

Related U.S. Application Data

[62] Division of application No. 08/395,352, Feb. 28, 1995, Pat. No. 5,629,354.

[51] Int. Cl.$^6$ ........................................... G03C 1/73
[52] U.S. Cl. ..................... 430/281.1; 430/288.1; 430/919; 430/920; 430/926; 522/25; 522/26; 522/28; 522/30; 522/173; 522/182
[58] Field of Search ................ 430/278.1, 281.1; 522/25, 26, 27, 28, 29, 30, 173, 180, 182, 183

[56] References Cited

U.S. PATENT DOCUMENTS

| | | | |
|---|---|---|---|
| 3,579,339 | 5/1971 | Chang et al. | 96/74 |
| 4,095,019 | 6/1978 | Markiewitz et al. | 526/215 |
| 4,278,751 | 7/1981 | Specht et al. | 430/281.1 |
| 4,766,055 | 8/1988 | Kawabata et al. | 430/81 |
| 4,868,092 | 9/1989 | Kawabata et al. | 430/287.1 |
| 4,921,827 | 5/1990 | Ali et al. | 430/281.1 |
| 4,939,069 | 7/1990 | Kawabata et al. | 430/281.1 |
| 4,965,171 | 10/1990 | Kawabata et al. | 430/288.1 |
| 4,971,892 | 11/1990 | Ali et al. | 430/281.1 |
| 5,153,236 | 10/1992 | Kaji et al. | 430/288.1 |
| 5,378,579 | 1/1995 | Arimatsu et al. | 430/281 |
| 5,445,918 | 8/1995 | Doba et al. | 430/288.1 |

FOREIGN PATENT DOCUMENTS

| | | |
|---|---|---|
| 0 290 133 | 11/1988 | European Pat. Off. . |
| 0 497 552 | 8/1992 | European Pat. Off. . |
| 0 552 578 | 1/1993 | European Pat. Off. . |
| 0522568 | 1/1993 | European Pat. Off. . |
| 0636939 | 2/1995 | European Pat. Off. . |
| 2433072 | 1/1996 | Germany . |
| 1660964 | 9/1991 | Japan . |
| 7-43896 | 2/1995 | Japan . |
| 95/09383 | 4/1995 | WIPO . |

OTHER PUBLICATIONS

Fouassier et al, Journal of Imaging Science and Technology, vol. 37, No. 2, Mar./Apr., 1993, p. 2.
Marino et al, Proceedings of the Radtech '94 Conference, vol. 1, p. 1691 (1994).
Yamaoka et al, Journal of Applied Polymer Science, vol. 38, 1271–1285 (1989).
B. M. Monroe and G.C. Weed, Chem. Rev., 93, 435–448 (1993).
M. Kawabata et al., J. Photopoly. Sci. Technol., 1 (2), 222–227 (1988).
D. P. Specht et al., Tetrahedron, 38, 1203–1211 (1982).
D.F. Eaton, Photo Sci and Eng., 23 (5), 150–154 (1979).
D.F. Eaton, Adv. in Photochem, 13, 427–487 (1986).

*Primary Examiner*—Maria Nuzzolillo
*Assistant Examiner*—Laura Weiner
*Attorney, Agent, or Firm*—Ratner & Prestia

[57] ABSTRACT

Improved photopolymerization initiator systems are comprised of a spectral sensitizer that sensitizes in the ultraviolet or visible regions of the spectrum and an N-aryl, O-aryl or S-aryl polycarboxylic acid co-initiator. The improved initiator systems are incorporated in photo-polymerizable compositions containing one or more addition-polymerizable ethylenically-unsaturated compounds to form compositions suitable for the preparation of radiation-sensitive layers in lithographic printing plates adapted to be imagewise-exposed with ultraviolet- or visible-light-emitting lasers such as argon-ion lasers and frequency doubled Nd:YAG lasers. Such plates are able to effectively meet the dual requirements of very high photospeed and very good shelf-life required in computer-to-plate systems.

22 Claims, No Drawings

5,942,372

SENSITIZED PHOTOPOLYMERIZABLE COMPOSITIONS AND USE THEREOF IN LITHOGRAPHIC PRINTING PLATES

This is a Divisional Application of application Ser. No. 08/395,352, filed Feb. 28, 1995, now U.S. Pat. No. 5,629,354.

FIELD OF THE INVENTION

This invention relates in general to photopolymerizable compositions and in particular to photopolymerizable compositions of the type which are suitable for direct digital exposure. More specifically, this invention relates to novel photopolymerizable compositions which are especially useful in the manufacture of lithographic printing plates and to lithographic printing plates prepared therefrom which can be imagewise exposed with ultraviolet- or visible-light-emitting lasers.

BACKGROUND OF THE INVENTION

It is well known in the art relating to the manufacture of lithographic printing plates to utilize a photopolymerizable composition as the image-forming layer. Typical photopolymerizable compositions for this purpose comprise one or more addition-polymerizable ethylenically-unsaturated compounds and a photopolymerization initiator system. The addition-polymerizable compounds can be monomers, oligomers or polymers, or mixtures thereof, and frequently the photopolymerizable composition will also include a film-forming polymeric binder.

Photopolymerizable compositions of the type which are suitable for direct digital exposure are of increasing importance to the printing industry. Such compositions find particular utility in so-called "direct-to-plate" or "computer-to-plate" systems which utilize image setters. Practical considerations have resulted in visible-light-emitting lasers, such as low power argon-ion lasers, being preferred for use with plate-capable image setters. The need for high writing speeds, coupled with the constraint of the low-powered lasers favored in the industry, has resulted in a requirement for printing plates that have very high photosensitivities. However, high photosensitivity alone is not enough as it is essential that the photopolymerizable composition also have good shelf-life.

In an effort to meet the dual objectives of high photosensitivity and good shelf-life, the prior art has proposed the use of a wide variety of different photopolymerization initiator systems, but has not been fully successful in simultaneously meeting the dual objectives. Among the most effective prior art photopolymerization initiator systems are those which comprise a spectral sensitizing dye and an N-aryl-α-amino acid, such as N-phenylglycine (NPG) or a derivative thereof, as a co-initiator. Thus, for example, U.S. Pat. No. 4,278,751 describes an initiator system comprising NPG and an amine-substituted ketocoumarin; U.S. Pat. Nos. 4,868,092 and 4,965,171 describe an initiator system in which the spectral sensitizing dye is a xanthene, coumarin or merocyanine and which includes both NPG, or certain derivatives thereof, and a diaryliodonium salt; and U.S. Pat. No. 5,153,236 describes an initiator system which includes an N-aryl-α-amino acid, such as NPG, and in which the spectral sensitizing dye is a thioxanthone, an isoalloxanine or a coumarin. Photopolymerizable compositions containing an initiator system comprising a coumarin, an iodonium salt and NPG are also described in J. P. Fouassier et al, "A New Three-Component System In Visible Laser Light Photo-Induced Polymerization", Journal Of Imaging Science And Technology, Vol. 37, No. 2, March/April, 1993.

In addition to the use of N-aryl-α-amino acids as co-initiators, it is also known to employ O-aryl and S-aryl compounds as described for example, in U.S. Pat. No. 4,939,069, issued Jul. 3, 1990.

Photoinitiating systems of the bimolecular type consisting of a radical generator and a sensitizing dye and mechanisms whereby they are believed to function are described in Yamaoka et al, "N-Phenylglycine-(Thio)xanthene Dye Photoinitiating System and Application to Photopolymer for Visible Laser Exposure", Journal of Applied Polymer Science, Vol. 38, 1271–1285 (1989). As pointed out by Yamaoka et al, bimolecular type photoinitiators consisting of N-phenylglycine and a xanthene or thioxanthene dye exhibit high initiating efficiency. However, such systems are deficient in regard to shelf-life.

Fluorone dyes are shown to work well as visible light photoinitiators in combination with NPG and iodonium salts in an article by Thomas L. Marino et al, entitled "Chemistry And Properties Of Novel Fluorone Visible Light Photoinitiators" published in the Proceedings of the Radtech '94 Conference, Vol. 1 page 1691, 1994 by Radtech International North America. The fluorone dyes described provide panchromatic absorption throughout the visible spectrum.

Use of NPG as a co-initiator in a photopolymerization initiator system provides excellent photospeed, but the composition tends to rapidly lose photospeed on aging, i.e., its shelf-life is poor. Thus, for example, D. F. Eaton has noted that the improvements in photosensitivity provided by amine activators in general and by NPG in particular are lost within days of preparation of photosensitive films containing such materials. See "Dye Sensitized Photopolymerization" by D. F. Eaton in Advances In Photochemistry, Vol. 13, D. Volman, K. Gollnick and G. S. Hammond, eds., Wiley Interscience (1986).

Arimatsu, U.S. Pat. No. 5,378,579, describes a photopolymerizable composition in which the NPG co-initiator has been derivatized with a compound such as glycidyl methacrylate in an effort to improve shelf-life. Such use of glycidyl methacrylate is, however, highly undesirable from an environmental standpoint, because of concerns relating to toxicity, and improvement in shelf-life is marginal at best.

Additional references relating to the use of iodonium salts in photopolymerizable compositions include Japanese Patent No. 1,660,964 (Patent Application No. 58-198085, filed Oct. 21, 1983, KOKAI No. 60-88005, published May 17, 1985, KOKOKU No. 3-62162, published Sep. 25, 1991) which describes a photopolymerization initiator system comprising a 3-ketocoumarin and a diaryl iodonium salt; U.S. Pat. No. 4,921,827, issued May 1, 1990, which describes a photopolymerization initiator system comprising at least one merocyanine sensitizer containing a constrained alkylamino group and an initiator selected from the group consisting of photosensitive iodonium salts, sulfonium salts and halomethyl s-triazines; and European Patent Application No. 0 290 133 which describes a photopolymerization initiator system comprising an aryliodonium salt, a sensitizer and an electron donor having an oxidation potential that is greater than zero and less than or equal to that of p-dimethoxybenzene.

While the photopolymerizable compositions of the prior art meet many of the needs of the lithographic printing plate industry, they still do not fully satisfy the dual requirements of high photospeed and good shelf-life that are urgently needed. It is toward the objective of better meeting these dual requirements that the present invention is directed.

SUMMARY OF THE INVENTION

In accordance with this invention, a novel photopolymerizable composition, suitable for use in the preparation of lithographic printing plates, is comprised of:
(1) at least one addition-polymerizable ethylenically-unsaturated compound, and
(2) a photopolymerization initiator system comprising:
    (A) a spectral sensitizer that sensitizes in the ultraviolet or visible regions of the spectrum, and
    (B) a polycarboxylic acid comprising an aromatic moiety substituted with a hetero atom selected from nitrogen, oxygen and sulfur and comprising at least two carboxyl groups with at least one of the carboxyl groups being linked to the hetero atom.

The polycarboxylic acids utilized in this invention as co-initiators comprise an aromatic moiety. By the term "aromatic moiety", as used herein, is meant a mono- or polynuclear hydrocarbon radical, such as a benzene, biphenyl, naphthalene or anthracene group. The aromatic moiety is substituted with a nitrogen, oxygen or sulfur atom so that the compounds can be referred to as N-aryl, O-aryl or S-aryl polycarboxylic acids. In addition to being substituted with a nitrogen, oxygen or sulfur atom, the aromatic moiety can optionally include one or more additional substituents.

The N-aryl polycarboxylic acids comprise an N-aryl nucleus which can be represented by the formula:

wherein Ar is a substituted or unsubstituted aryl group. Similarily, the O-aryl polycarboxylic acids comprise an O-aryl nucleus which can be represented by the formula:

and the S-aryl polycarboxylic acids comprise an S-aryl nucleus which can be represented by the formula:

The polycarboxylic acids utilized in this invention include within their structure at least two carboxyl groups with at least one of the carboxyl groups being linked to the hetero atom. Thus, the O-aryl and S-aryl polycarboxylic acids have a carboxyl group linked to the oxygen or sulfur atom, respectively, and one or more carboxyl groups linked to the Ar group.

The N-aryl polycarboxylic acids can have one carboxyl group linked to the nitrogen atom and one or more carboxyl groups linked to the Ar group, or they can have two carboxyl groups linked to the nitrogen atom and no carboxyl groups linked to the Ar group, or they can have two carboxyl groups linked to the nitrogen atom and one or more carboxyl groups linked to the Ar group. When the nitrogen atom is substituted with only one carboxyl group, the other substituent on the nitrogen atom can be hydrogen or a monovalent organic radical such as an alkyl group.

Whether they are N-aryl, O-aryl or S-aryl compounds, the co-initiators of this invention are polycarboxylic acids. By contrast, the N-aryl-α-amino carboxylic acids, such as NPG, which have heretofore been utilized as co-initiators are monocarboxylic acids.

In the present invention, it is preferred that the heteroatom be a nitrogen atom and, accordingly, that the polycarboxylic acid be an N-aryl polycarboxylic acid and particularly preferred to utilize an N-aryl polycarboxylic acid in which at least one carboxyl group is linked to the nitrogen atom of the N-aryl nucleus by means of a methylene ($-CH_2-$) linking group.

In one preferred embodiment of the invention, the co-initiator is a polycarboxylic acid of the formula:

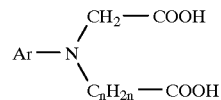

wherein Ar is a substituted or unsubstituted aryl group and n is an integer with a value of from 1 to 5.

In a second preferred embodiment of the invention, the co-initiator is a polycarboxylic acid of the formula:

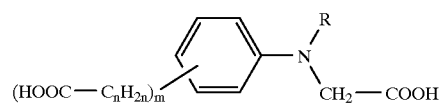

wherein n is an integer with a value of from 1 to 5,
m is an integer with a value of from 1 to 5, and
R is hydrogen or an alkyl group of 1 to 6 carbon atoms.

In a third preferred embodiment of the invention, the co-initiator is a dicarboxylic acid of the formula:

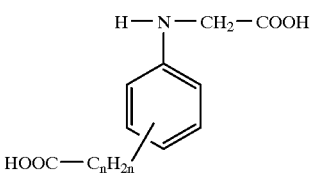

wherein n is an integer with a value of from 1 to 5.

In a fourth preferred embodiment of the invention, the co-initiator is a diacetic acid of the formula:

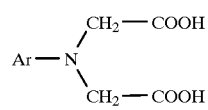

wherein Ar is a substituted or unsubstituted aryl group.

In a fifth preferred embodiment of the invention, the co-initiator is a diacetic acid of the formula:

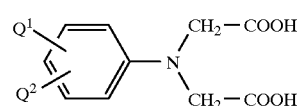

wherein $Q^1$ and $Q^2$ are independently hydrogen, alkyl, alkoxy, thioalkyl, aryl, aryloxy or halogen.

In the most preferred embodiment of the invention, the co-initiator is anilinediacetic acid which has the formula:

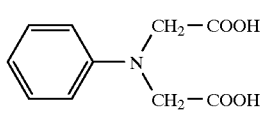

This compound can also be referred to as N-phenyliminodiacetic acid or as N-(carboxymethyl)-N-phenylacetic acid.

The term "photopolymerization" is used herein in a broad sense to include photocrosslinking and photodimerization of macromolecules as well as to describe the photoinduced initiation of vinyl polymerization. Thus, the photopolymerizable compositions in which the novel photopolymerization initiator system of this invention is useful can vary widely in composition and properties.

As hereinabove described, it is well known in the art to use the compound N-phenylglycine (NPG) which has the formula:

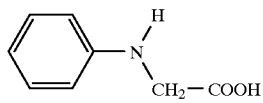

as a co-initiator in a photopolymerization initiator system comprising a spectral sensitizer that sensitizes in the ultraviolet or visible regions of the spectrum. However, the co-initiators of this invention are much more effective than N-phenylglycine in meeting the dual objectives of high photosensitivity and good shelf-life.

N-aryl-α-amino carboxylic acids, such as NPG, which have heretofore been proposed for use as co-initiators in photopolymerization initiator systems are monocarboxylic acids. In marked contrast, the co-initiators of this invention are polycarboxylic acids which comprise two or more carboxyl groups. The presence of the additional carboxyl substitution has been found, most unexpectedly, to contribute greatly to meeting the dual requirements of high photospeed and good shelf-life. While applicants do not intend to be bound by any theoretical explanation of the manner in which their invention functions, it is believed that the improved performance may be related to the ability of the polycarboxylic acid co-initiator to resist thermal decarboxylation.

DETAILED DESCRIPTION OF THE INVENTION

In a particular embodiment, the present invention is directed to a novel photopolymerization initiator system comprising (A) a spectral sensitizer that sensitizes in the ultraviolet or visible regions of the spectrum and (B) a polycarboxylic acid co-initiator as herein described.

In a further particular embodiment, the present invention is directed to a novel photopolymerizable composition comprising (1) at least one addition-polymerizable ethylenically-unsaturated compound and (2) a photopolymerization initiator system comprising (A) a spectral sensitizer that sensitizes in the ultraviolet or visible regions of the spectrum and (B) a polycarboxylic acid co-initiator as herein described.

In a still further embodiment, the present invention is directed to a novel lithographic printing plate comprising a support having thereon a radiation-sensitive layer adapted to form a lithographic printing surface in which the radiation-sensitive layer is comprised of the aforesaid novel photopolymerizable composition.

In yet another embodiment, the present invention is directed to a novel process of forming a lithographic printing surface comprising the steps of:
(I) providing a lithographic printing plate comprising a support having thereon a radiation-sensitive layer comprised of the aforesaid novel photopolymerizable composition;
(II) imagewise exposing the radiation-sensitive layer of such lithographic printing plate with an ultraviolet- or visible-light-emitting laser, and
(III) subjecting the imagewise-exposed lithographic printing plate to development to remove the non-exposed areas of the radiation-sensitive layer and reveal the underlying support.

The improved photopolymerizable compositions of this invention comprise at least three essential components, namely, an addition-polymerizable ethylenically-unsaturated compound, a spectral sensitizer that sensitizes in the ultraviolet or visible regions of the spectrum, and a polycarboxylic acid co-initiator as herein described. A wide variety of other ingredients can optionally be included in the composition to improve its performance.

Any of a very broad range of addition-polymerizable ethylenically-unsaturated compounds can be utilized in this invention. Examples include acrylates, methacrylates, acrylamides, methacrylamides, allyl compounds, vinyl ethers, vinyl esters, N-vinyl compounds, styrenes, itaconates, crotonates, maleates and the like. The addition-polymerizable ethylenically-unsaturated compound can be a monomer, a pre-polymer such as a dimer, trimer or other oligomer, a homopolymer, a copolymer, or mixtures thereof.

Acrylic compounds are especially useful as the addition-polymerizable ethylenically unsaturated compound. Useful acrylic compounds include mono-functional monomers and polyfunctional monomers. Examples of monofunctional acrylic monomers that are useful in the compositions of this invention include acrylic and methacrylic esters such as ethyl acrylate, butyl acrylate, 2-hydroxypropyl acrylate, cyclohexyl acrylate, 2-ethylhexyl acrylate, methyl methacrylate, ethyl methacrylate, and the like. Examples of polyfunctional acrylic monomers that are useful include:
neopentylglycol diacrylate
pentaerythritol triacrylate
1,6-hexanediol diacrylate
trimethylolpropane triacrylate
tetraethylene glycol diacrylate
1,3-butylene glycol diacrylate
trimethylolpropane trimethacrylate
1,3-butylene glycol dimethacrylate
ethylene glycol dimethacrylate
pentaerythritol tetraacrylate
tetraethylene glycol dimethacrylate
1,6-hexanediol dimethacrylate
ethylene glycol diacrylate
diethylene glycol diacrylate
glycerol diacrylate
glycerol triacrylate
1,3-propanediol diacrylate
1,3-propanediol dimethacrylate
1,2,4-butanetriol trimethacrylate
1,4-cyclohexanediol diacrylate
1,4-cyclohexanediol dimethacrylate
pentaerythritol diacrylate
1,5-pentanediol dimethacrylate, and the like.

Preferred polyfunctional acrylic monomers are those of the formula:

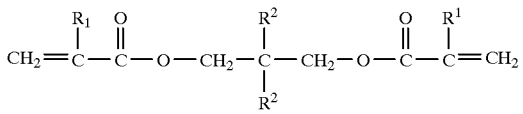

wherein each $R^1$ is independently selected from the group consisting of a hydrogen atom and an alkyl group of 1 to 2 carbon atoms, and each $R^2$ is independently selected from the group consisting of an alkyl group of 1 to 6 carbon atoms and a radical of the formula:

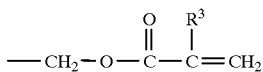

in which $R^3$ is a hydrogen atom or an alkyl group of 1 to 2 carbon atoms.

Poly(alkylene glycol)diacrylates are also especially useful in the present invention as the addition-polymerizable ethylenically-unsaturated compound. Examples are compounds represented by the following formula:

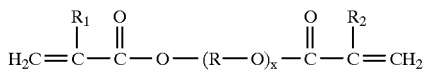

wherein R is an alkylene radical of 2 to 4 carbon atoms, $R_1$ and $R_2$ are independently H or $CH_3$, and x is an integer having a value of from 3 to 50.

Included among the useful poly(alkylene glycol) diacrylates are those comprising ethyleneoxy, propyleneoxy or butyleneoxy groups. As indicated by the above formula, the terminal groups can be acrylate or methacrylate groups.

The photopolymerizable compositions of this invention can include a photocrosslinkable polymer. Typical of such photocrosslinkable polymers are those containing the photosensitive group —CH=CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 1,4-bis(β-hydroxyethoxy) cyclohexane.

An essential component of the photo-polymerizable compositions of this invention is a spectral sensitizer that sensitizes in the ultraviolet or visible regions of the spectrum. Any of a very broad range of spectral sensitizers can be used for this purpose. Examples of preferred spectral sensitizers are coumarins, fluoresceins, fluorones, xanthenes, merocyanines, thioxanthones, isoalloxanines and the like.

Particularly preferred spectral sensitizers for use in this invention are 3-substituted coumarins as described in Specht et al, U.S. Pat. No. 4,147,552, issued Apr. 3, 1979. These coumarins have an absorptive maximum between about 250 and about 550 nm. As described in the '552 patent, they can be represented by the formula:

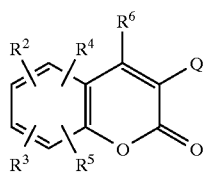

wherein Q is —CN or —Z—$R^1$; Z is carbonyl, sulfonyl, sulfinyl or arylenedicarbonyl;

$R^1$ is alkenyl; alkyl having 1–12 carbon atoms, aryl of 6–10 nuclear carbon atoms; a carbocyclic group of 5–12 carbon atoms; or a heterocyclic group having 5–15 nuclear carbon and hetero atoms;

$R^2$, $R^3$, $R^4$ and $R^5$ each independently is hydrogen, alkoxy having 1–6 carbon atoms, dialkylamino with each alkyl of the dialkylamino group having 1–4 carbon atoms, halogen, acyloxy, nitro, a 5- or 6-membered heterocyclic group, or a group having the formula:

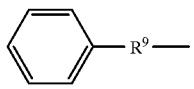

wherein $R^9$ is an alkylene radical having from 1–5 carbon atoms;

$R^6$ is hydrogen, alkyl having 1–4 carbon atoms, aryl of 6–10 carbon atoms; and wherein two or three of $R^2$-$R^5$ and the nuclear carbon atoms to which they are attached can together form a fused ring or fused ring system, each ring being a 5- to 6-membered ring.

Typical examples of useful 3-substituted coumarins include:
3-benzoyl-5,7-dimethoxycoumarin
3-benzoyl-7-methoxycoumarin
3-benzoyl-6-methoxycoumarin
3-benzoyl-8-ethoxycoumarin
7-methoxy-3-(p-nitrobenzoyl)coumarin
3-benzoylcoumarin
3-(p-nitrobenzoyl)coumarin
3-benzoylbenzo[f]coumarin
3,3'-carbonylbis(7-methoxycoumarin)
3-acetyl-7-methoxycoumarin
3-benzoyl-6-bromocoumarin
3,3'-carbonylbiscoumarin
3-benzoyl-7-dimethylaminocoumarin
3,3'-carbonylbis(7-diethylaminocoumarin)
3-carboxycoumarin
3-carboxy-7-methoxycoumarin
3-methoxycarbonyl-6-methoxycoumarin
3-ethoxycarbonyl-6-methoxycoumarin
3-ethoxycarbonyl-7-methoxycoumarin
3-methoxycarbonyl-7-methoxycoumarin
3-acetylbenzo[f]coumarin
3-acetyl-7-methoxycoumarin
3-(1-admantoyl)-7-methoxycoumarin
3-benzoyl-7-hydroxycoumarin
3-benzoyl-6-nitrocoumarin
3-benzoyl-7-acetoxycoumarin
3-[3-(p-ethoxyphenyl)acryloyl]-7-methoxycoumarin
3-benzoyl-7-diethylaminocoumarin
7-dimethylamino-3-(4-iodobenzoyl)coumarin
7-diethylamino-3-(4-iodobenzoyl)coumarin
3,3'-carbonylbis(5,7-diethoxycoumarin)
3-(2-benzofuroyl)-7-(1-pyrrolidinyl)coumarin
7-diethylamino-3-(4-dimethylaminobenzoyl)coumarin
7-methoxy-3-(4-methoxybenzoyl)coumarin
3-(4-nitrobenzoyl)benzo[f]coumarin
3-(4-ethoxycinnamoyl)-7-methoxycoumarin
3-(4-dimethylaminocinnamoyl)coumarin
3-(4-diphenylaminocinnainoyl)coumarin
3-[(3-methylbenzothiaz]-2-ylidene)acetyl]coumarin
3-[(1-methylnaphtho[1,2-d]thiazol-2-ylidene)acetyl]-coumarin
3,3'-carbonylbis(6-methoxycoumarin)
3,3'-carbonylbis(7-acetoxycoumarin)
3,3'-carbonylbis(7-dimethylaminocoumarin)
3,3'-carbonylbis(5,7-di-isopropoxycoumarin)
3,3'-carbonylbis(5,7-di-n-propoxycoumarin)
3,3'-carbonylbis(5,7-di-n-butoxycoumarin)
3,3'-carbonylbis[5,7-di(2-phenylethoxy)coumarin]
3,3'-carbonylbis[5,7-di(2-chloroethoxy)coumarin]

3-cyano-6-methoxycoumarin
3-cyano-7-methoxycoumarin
7-methoxy-3-phenylsulfonylcoumarin
7-methoxy-3-phenylsulfinylcoumarin
1,4-bis(7-diethylamino-3-coumarylcarbonyl)benzene
7-diethylamino-5',7'-dimethoxy-3,3'carbonylbiscoumarin
7-dimethylamino-3-thenoyl coumarin
7-diethylamino-3-furoyl coumarin
7-diethylamino-3-thenoyl coumarin
3-benzoyl-7-(1-pyrrolidinyl)coumarin
3-(4-fluorosulfonyl)benzoyl-7-methoxycoumarin
3-(3-fluorosulfonyl)benzoyl-7-methoxycoumarin
5,7,6'-trimethoxy-3,3'-carbonylbiscoumarin
5,7,7'-trimethoxy-3,3'-carbonylbiscoumarin
7-diethylamino-6'-methoxy-3,3'-carbonylbiscoumarin
3-nicotinoyl-7-methoxycoumarin
3-(2-benzofuroyl)-7-methoxycoumarin
3-(7-methoxy-3-coumarinoyl)-1-methylpyridinium fluorosulfate
3-(5,7-diethoxy-3-coumarinoyl)-1-methylpyridinium fluoroborate
N-(7-methoxy-3-coumarinoylmethyl)pyridinium bromide
3-(2-benzofuroyl)-7-diethylaminocoumarin
7-(1-pyrrolidinyl)-3-thenoylcoumarin
7-methoxy-3-(4-pyridinoyl)coumarin
3,6-dibenzoylcoumarin
N-(7-methoxy-3-coumarinoylmethyl)-N-phenylacetamide and
9-(7-diethylamino-3-coumarinoyl)-1,2,4,5-tetrahydro-3H,6H,10H[1]benzopyrano[9,9a,1-gh]quinolazine-10-one.

Of the coumarin sensitizers, the 3-ketocoumarins are especially preferred for use in this invention.

Among the wide variety of sensitizers suitable for use in this invention, the merocyanine sensitizers containing a constrained alkylamino group are particularly preferred because of their ability to provide high photospeed. Such sensitizers are described, for example, in U.S. Pat. No. 4,921,827 which defines a constrained alkylamino group as a saturated heterocyclic structure containing at least one nitrogen atom which is directly attached to an existing aromatic ring of the merocyanine.

A preferred sensitizer for use in the present invention is 10-(3-(4-diethylamino)phenyl)-1-oxo-2-propenyl)-2,3,6,7-tetrahydro-1H,5H,11H-(1)benzopyrano(6,7,8-ij)quinolizin-11-one which has the formula:

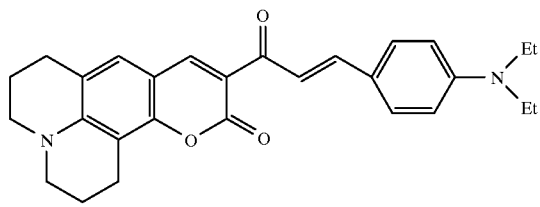

This sensitizer is described in U.S. Pat. Nos. 4,289,844 and 4,366,228, is identified as "Sensitizer A" in U.S. Pat. No. 4,921,827 and is referred to hereinafter as Sensitizer A.

Another preferred sensitizer for use in the present invention is 3,3'-carbonylbis(7-diethylaminocoumarin) which has the formula:

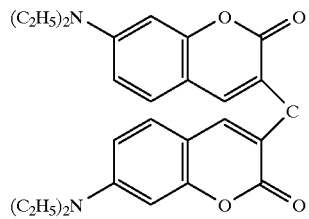

This sensitizer and its synthesis are described in U.S. Pat. No. 4,147,552. It is referred to hereinafter as Sensitizer B.

It is advantageous to use mixtures of spectral sensitizers in this invention and a particularly useful mixture is a mixture of Sensitizer A and Sensitizer B. Sensitizer B is particularly effective when it is desired to expose with an argon-ion laser that emits at 488 nanometers but is not effective for use with a frequency doubled Nd:YAG laser that emits at 532 nanometers. Sensitizer A is equally effective at 488 nanometers and 532 nanometers but its efficiency is significantly less than that of Sensitizer B. By using a mixture of Sensitizers A and B, optimum results are obtained whether the chosen exposure source is an argon-ion laser or a frequency doubled Nd:YAG laser.

As hereinabove described, the photopolymerization initiator system of this invention includes a spectral sensitizer that sensitizes in the ultraviolet or visible regions of the spectrum and a polycarboxylic acid co-initiator comprising an aromatic moiety substituted with a hetero atom selected from nitrogen, oxygen and sulfur and comprising at least two carboxyl groups with at least one of the carboxyl groups being linked to the hetero atom. N-aryl polycarboxylic acid co-initiators are especially effective in this invention and examples of preferred N-aryl polycarboxylic acid co-initiators include those of the following formulae I, II, III, IV and V:

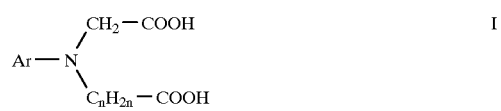

wherein Ar is a substituted or unsubstituted aryl group and n is an integer with a value of from 1 to 5.

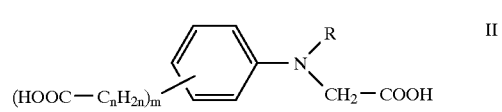

wherein n is an integer with a value of from 1 to 5, m is an integer with a value of from 1 to 5, and R is hydrogen or an alkyl group of 1 to 6 carbon atoms.

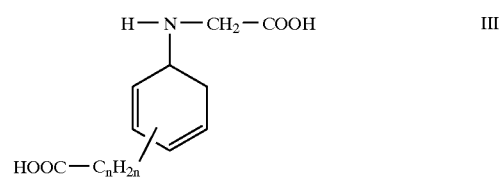

wherein n is an integer with a value of from 1 to 5.

(IV)

wherein Ar is a substituted or unsubstituted aryl group.

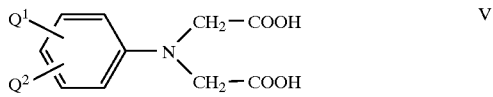
(V)

wherein $Q^1$ and $Q^2$ are independently hydrogen, alkyl, alkoxy, thioalkyl, aryl, aryloxy or halogen.

Preferably $Q^1$ and $Q^2$ are independently selected from the group consisting of hydrogen, methyl, ethyl, propyl, butyl, methoxy, ethoxy, propoxy, butoxy, thiomethyl, thioethyl and chloro.

Specific examples of N-aryl, O-aryl and S-aryl polycarboxylic acids that can be used as co-intiators in this invention include:
anilinediacetic acid
(p-acetamidophenylimino)diacetic acid
3-(bis(carboxymethyl)amino)benzoic acid
4-(bis(carboxymethyl)amino)benzoic acid
2-[(carboxymethyl)phenylamino]benzoic acid
2-[(carboxymethyl)methylamino]benzoic acid
2-[(carboxymethyl)methylamino]-5-methoxybenzoic acid
3-[bis(carboxymethyl)amino]-2-naphthalenecarboxylic acid
N-(4-aminophenyl)-N-(carboxymethyl)glycine
N,N'-1,3-phenylenebisglycine
N,N'-1,3-phenylenebis[N-(carboxymethyl)]glycine
N,N'-1,2-phenylenebis[N-(carboxymethyl)]glycine
N-(carboxymethyl)-N-(4-methoxyphenyl)glycine
N-(carboxymethyl)-N-(3-methoxyphenyl)glycine
N-(carboxymethyl)-N-(3-hydroxyphenyl)glycine
N-(carboxymethyl)-N-(3-chlorophenyl)glycine
N-(carboxymethyl)-N-(4-bromophenyl)glycine
N-(carboxymethyl)-N-(4-chlorophenyl)glycine
N-(carboxymethyl)-N-(2-chlorophenyl)glycine
N-(carboxymethyl)-N-(4-ethylphenyl)glycine
N-(carboxymethyl)-N-(2,3-dimethylphenyl)glycine
N-(carboxymethyl)-N-(3,4-dimethylphenyl)glycine
N-(carboxymethyl)-N-(3,5-dimethylphenyl)glycine
N-(carboxymethyl)-N-(2,4-dimethylphenyl)glycine
N-(carboxymethyl)-N-(2,6-dimethylphenyl)glycine
N-(carboxymethyl)-N-(4-formylphenyl)glycine
N-(carboxymethyl)-N-ethylanthranilic acid
N-(carboxymethyl)-N-propylanthranilic acid
5-bromo-N-(carboxymethyl)anthranilic acid
N-(2-carboxyphenyl)glycine
o-dianisidine-N,N,N',N'-tetraacetic acid
N,N'-[1,2-ethanediylbis(oxy-2,1-phenylene)]bis[N-(carboxymethyl)glycine]
4-carboxyphenoxyacetic acid
catechol-O,O'-diacetic acid
4-methylcatechol-O,O'-diacetic acid
resorcinol-O,O'-diacetic acid
hydroquinone-O,O'-diacetic acid
α-carboxy-o-anisic acid
4,4'-isopropylidenediphenoxyacetic acid
2,2'-(dibenzofuran-2,8-diyldioxy)diacetic acid
2-(carboxymethylthio)benzoic acid
5-amino-2-(carboxymethylthio)benzoic acid
3-[(carboxymethyl)thio]-2-naphthalenecarboxylic acid In addition to the spectral sensitizer and polycarboxylic acid co-initiator, it is particularly preferred to include in the photopolymerization initiator system of this invention a second co-initiator selected from the group consisting of (1) iodonium salts, (2) titanocenes, (3) haloalkyl-substituted s-triazines, (4) hexaaryl bisimidazoles, (5) photooxidants containing a heterocyclic nitrogen atom that is substituted by either an alkoxy group or an acyloxy group such as, for example, the N-alkoxypyridinium salts, and (6) alkyltriarylborate salts. The use of one or more of the aforesaid second co-initiators improves the performance of the photopolymerizable composition in terms of meeting the dual requirements of high photospeed and good shelf-life.

Preferred iodonium salts for use in this invention are iodonium salts of the formula:

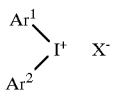

in which $Ar^1$ and $Ar^2$ independently represent substituted or unsubstituted aromatic groups and $X^-$ represents an anion.

Particularly preferred iodonium salts for use in this invention are diaryl iodonium salts of the formula:

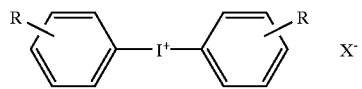

wherein each R is independently hydrogen, halogen, alkyl, alkoxy or nitro and X is an anion such as $Cl^-$, $BF_4^-$, $PF_6^-$, $AsF_6^-$ or $SbF_6^-$.

Specific examples of iodonium salts that are useful in this invention include:
diphenyliodonium hexafluorophosphate
4-octyloxyphenylphenyliodonium hexafluorophosphate
bis(dodecylphenyl)iodonium hexafluoroantimonate
4-isooctyloxyphenylphenyliodonium hexafluorophosphate,
diphenyliodonium trifluoromethanesulfonate
4-octyloxyphenylphenyliodonium tosylate
4,4'-di-t-butyl-diphenyliodonium hexafluorophosphate
4-butoxyphenylphenyliodonium trifluoroacetate
diphenyliodonium naphthalenesulfonate
3,3'-dinitrodiphenyliodonium hexafluorophosphate
4,4'-dichlorodiphenyliodonium tosylate
4-methoxyphenylphenyliodonium tetrafluoroborate and the like.

The use of iodonium salts in combination with spectral sensitizers to form a photopolymerization initiator system is well known in the art. References disclosing such combinations are discussed herein in the section entitled "Background Of The Invention." Such references include Japanese Patent No. 1,660,964 (KOKOKU 3-62162) assigned to the Agency for Industrial Science and Technology, which describes photopolymerization initiator systems comprising a 3-ketocoumarin and a diaryl iodonium salt, European Patent Application No. 0 290 133, published Nov. 9, 1988, which describes photopolymerization initiator systems comprising a spectral sensitizer, an aryliodonium salt and an electron donor having an oxidation potential that is greater than zero and less than or equal to that of p-dimethoxybenzene; and U.S. Pat. No. 4,921,827 which describes photopolymerization initiator systems comprising a merocyanine sensitizer containing a constrained alkylamino group and a co-initiator selected from diaryl iodonium salts, halogenated triazines and triaryl sulfonium salts. However, it was not heretofore known to include an N-aryl, O-aryl or S-aryl polycarboxylic acid as a co-initiator in a photopolymerization initiator system containing both a spectral sensitizer and an iodonium salt.

In marked contrast with the benefits provided by the use in this invention of iodonium salts as a second co-initiator, use of sulfonium or diazonium salts for this purpose has been found to bring about no change in photospeed or a reduction in photospeed.

Titanocenes which are especially useful as a second co-initiator in the photopolymerization initiator system of this invention include those described in U.S. Pat. No. 5,306,600. Of particular interest is the titanocene compound bis($\eta$5-2,4-cyclopentadienyl-1-yl)-bis{2,6-difluoro-3-(1H-pyrrol-1-yl)phenyl}titanium which has the following formula:

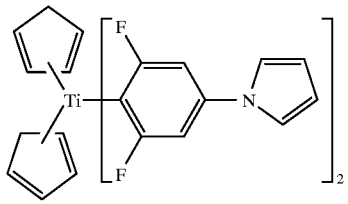

Another class of compounds that are useful as a second co-initiator in the present invention are the photooxidants described in U.S. Pat. No. Reissue 28,240, the disclosure of which is incorporated herein by reference. These are photooxidants which contain a heterocyclic nitrogen atom that is substituted by either an alkoxy group or an acyloxy group. As described in U.S. Pat. No. Re 28,240 typical photooxidants of this class are represented by one of the formulas:

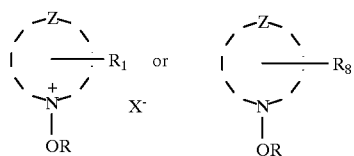

wherein $R_1$ can be any of the following:
  a. a methine linkage terminated by a heterocyclic nucleus of the type contained in cyanine dyes, e.g., those set forth in Mees and James, "The Theory of the Photographic Process," Macmillan, 3rd ed, pp. 198–232; the methine linkage can be substituted or unsubstituted, e.g., —CH=, —C(CH$_3$)=, —C(C$_6$H$_5$)=, —CH=CH—, —CH=CH—CH=, etc.;
  b. an alkyl radical preferably containing one to eight carbon atoms including a substituted alkyl radical;
  c. an aryl radical including a substituted aryl radical such as a phenyl radical, a naphthyl radical, a tolyl radical, etc.;
  d. a hydrogen atom;
  e. an acyl radical having the formula:

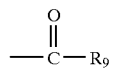

wherein $R_9$ is hydrogen or an alkyl group preferably having one to eight carbon atoms;
  f. an anilinovinyl radical such as a radical having the formula:

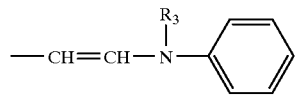

wherein $R_3$ is hydrogen, acyl or alkyl, or
  g. a styryl radical including substituted styryl radicals, e.g.,

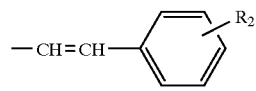

wherein $R_2$ is hydrogen, alkyl, aryl, amino, including dialkylamino such as dimethylamino;

$R_8$ can be either of the following:
  a. a methine linkage terminated by a heterocyclic nucleus of the type contained in merocyanine dyes, e.g., those set forth in Mees and James (cited above); the methine linkage can be substituted or unsubstituted; or
  b. an allylidene radical including a substituted allylidene radical such as a cyanoallylidene radical, an alkylcarboxyallylidene radical or an alkylsufonylallylidene radical;

R can be either:
  a. an alkyl radical preferably having one to eight carbon atoms such as methyl, ethyl, propyl, butyl, etc., including a substitued alkyl radical such as sulfoalkyl, e.g., —(CH$_2$)$_3$SO$_3$—, an aralkyl, e.g., benzyl or pyridinatooxyalkyl salt, e.g., —(CH$_2$)$_3$—O—Y wherein Y is substituted or unsubstituted pyridinium salt; etc.,
  b. an acyl radical, e.g.,

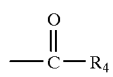

wherein $R_4$ is an alkyl radical preferably having one to eight carbon. atoms or aryl radical, e.g., methyl, ethyl, propyl, butyl, phenyl, naphthyl, etc.

Z represents the atoms necessary to complete a five- to six-membered heterocyclic nucleus, which nucleus can contain at least one additional heteroatom such as oxygen, sulfur, selenium or nitrogen, e.g., a pyridine nucleus, a quinoline nucleus, etc.; and X$^-$ represents an acid anion, e.g, chloride, bromide, iodide, perchlorate, sulfamate, thiocyanate, p-toluenesulfonate, methyl sulfate, tetrafluoroborate, etc.

Examples of photooxidants of the class described in Reissue U.S. Pat. No. Re 28,240 which are especially preferred for use in this invention include:

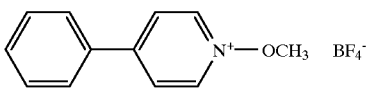

N-methyl-4-phenylpyridinium tetrafluoroborate

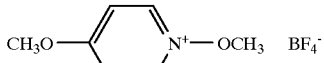

N-4-dimethoxypyridinium tetrafluoroborate

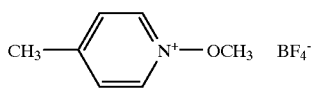

N-methoxy-4-methylpyridinium tetrafluoroborate

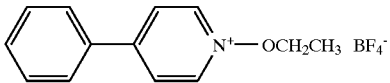

N-ethoxy-4-phenylpyridinium tetrafluoroborate

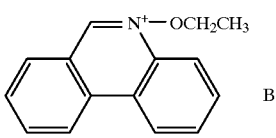

N-ethoxyphenanthridinium tetrafluoroborate

Of the photooxidants of Reissue U.S. Pat. No. Re 28,240, those that are most preferred for use in the present invention are the N-alkoxypyridinium salts.

Haloalkyl-substituted s-triazines are also useful as a second co-initiator in the present invention. Preferred haloalkyl-substituted s-triazines for use in this invention are compounds of the formula:

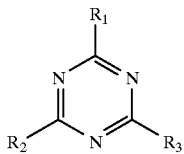

wherein $R_1$ is a substituted or unsubstituted aliphatic or aromatic radical and $R_2$ and $R_3$ are, independently, haloalkyl groups.

In the above formula, it is especially preferred that $R_2$ and $R_3$ are haloalkyl groups of 1 to 4 carbon atoms.

Particularly preferred haloalkyl-substituted s-triazines for use in this invention are compounds of the formula:

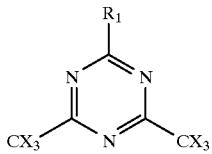

wherein $R_1$ is a substituted or unsubstituted aliphatic or aromatic radical and each X is, independently, a halogen atom.

A specific example of a preferred haloalkyl-substituted s-triazine for use in this invention is 2,4,6-tris (trichloromethyl)-s-triazine.

Hexaaryl bisimidazoles represent a further class of compounds that are useful as a second co-initiator in the present invention. An example of a useful hexaaryl bisimidazole is the compound 2,2'-bis(o-chlorophenyl)-4,4',5,5'-tetraphenylbisimidazolyl which has the formula:

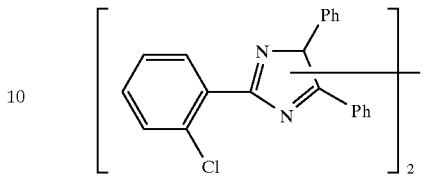

wherein Ph represents a phenyl group.

Alkyltriarylborate salts represent a still further class of compounds that are useful as a second co-initiator in the present invention. The alkyltriarylborate salts which are especially useful are salts of the formula:

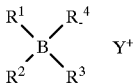

wherein each of $R^1$, $R^2$ and $R^3$ is, independently, an aryl group of 6 to 12 carbon atoms, $R^4$ is an alkyl group of 1 to 12 carbon atoms, and Y is a counterion such as ammonium, tetramethylammonium or an alkali metal. The three aryl groups are preferably phenyl or lower alkyl substituted phenyl groups such as tolyl and xylyl. The alkyl group is preferably lower alkyl such as methyl, ethyl or n-butyl.

Iodonium salts are particularly useful in this invention because of their ability to both substantially improve photospeed and substantially improve shelf-life. Thus, a composition containing both an N-aryl, O-aryl or S-aryl polycarboxylic acid and an iodonium salt represents a preferred embodiment of the invention. Incorporating a titanocene in the composition, in addition to the iodonium salt and the polycarboxylic acid, affords additional photospeed which is not obtainable by simply increasing the concentration of either the iodonium salt or the polycarboxylic acid.

Preferred iodonium salts for use in this invention are the non-toxic alkoxy-substituted salts described in U.S. Pat. Nos. 4,882,201, 4,981,881, 5,010,118, 5,082,686 and 5,144,051. These compounds are preferably utilized as the hexafluorophosphate salt rather than the hexafluoroantimonate salt when the lithographic printing plate utilizes an aluminum support. The reason for such preference is that the incompatability of the hexafluoroantimonate counter-ion with the aluminum substrate harms the shelf-life of the plate.

In the photopolymerizable compositions of this invention, the spectral sensitizer is typically used in an amount of from about 0.001 to about 0.1 parts per part by weight of the addition-polymerizable ethylenically-unsaturated compound, while the polycarboxylic acid co-initiator is typically used in an amount of from about 0.05 to about 0.5 parts per part by weight of the addition-polymerizable ethylenically-unsaturated compound. When a second co-initiator is employed, it is typically used in an amount of from about 0.05 to about 0.5 parts per part by weight of the addition-polymerizable ethylenically-unsaturated compound.

The photopolymerizable compositions of this invention can optionally contain a film-forming binder. Such use of film-forming binders can be particularly advantageous in improving the wear resistance of the layer formed therefrom.

Useful film-forming binders include styrene-butadiene copolymers; silicone resins; styrene-alkyd resins; silicone-alkyd resins; soy-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); polyacrylic and -methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-co-alkaryloxyalkylene terephthalate); phenol-formaldehyde resin; ketone resins; polyamides; polycarbonates; polythiocarbonates, poly(ethylene 4,4'-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin.

Particular advantages are achieved by the use of acetal polymers as the film-forming binder. Examples of useful acetal polymers are those described in U.S. Pat. Nos. 4,652,604, 4,741,985, 4,940,646, 5,169,897 and 5,169,898.

In U.S. Pat. No. 4,652,604, the acetal polymer contains acetal groups of three types, namely six-membered cyclic acetals, five-membered cyclic acetals and intermolecular acetals. In U.S. Pat. No. 4,741,985, the acetal polymer is a mono-acetal containing a six-membered cyclic acetal group. In U.S. Pat. No. 4,940,646, the acetal polymer contains vinyl acetal units derived from an aldehyde that contains hydroxyl groups. In U.S. Pat. No. 5,169,897 the acetal polymer is a binary acetal polymer comprised of recurring units which include two six-membered cyclic acetal groups, one of which is unsubstituted or substituted with an alkyl or hydroxyalkyl group and the other of which is substituted with an aromatic or heterocyclic moiety. In U.S. Pat. No. 5,169,898 the acetal polymer is a ternary acetal polymer comprised of recurring units which include three six-membered cyclic acetal groups, one of which is unsubstituted or substituted with an alkyl or hydroxyalkyl group, another of which is substituted with an aromatic or heterocyclic moiety, and a third of which is substituted with an acid group, an acid-substituted alkyl group or an acid-substituted aryl group.

The acid-substituted ternary acetal polymers of U.S. Pat. No. 5,169,898 are especially useful in this invention. As described in the '898 patent these acid-substituted ternary acetal polymers have recurring units represented by the formula:

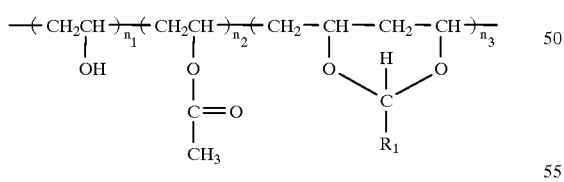

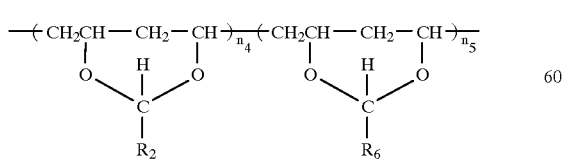

wherein $R_1$ is —H, —$C_nH_{2n+1}$ or —$C_nH_{2n}$—OH where n=1–12

$R_2$ is

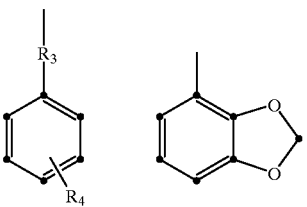

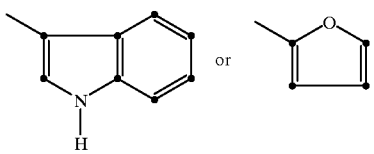

where $R_3$ is

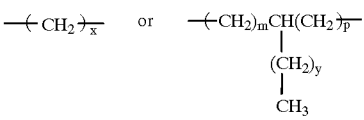

and x=0–8
m=0–8
y=0–8
p=0–8
$R_4$=—H, —$R_5$,

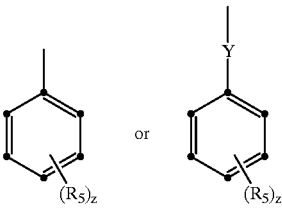

in which Y=

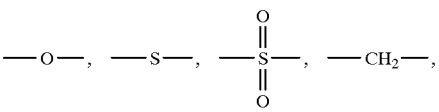

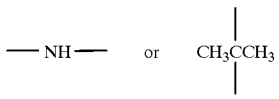

$R_5$=—OH, —$CH_2OH$, —$OCH_3$, —COOH or —$SO_3H$ z=1 to 3

$R_6$=—$(CH_2)_a$—COOH

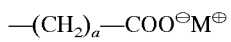

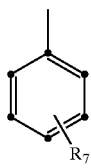

where
R$_7$=—COOH, —COO$^\ominus$M$^\oplus$, —(CH$_2$)$_a$COOH,
—O—(CH$_2$)$_a$COOH,
—SO$_3$H, —S$_3^\ominus$M$^\oplus$, —PO$_3$H$_2$, —PO$_3^\ominus$M$_2^\oplus$,
PO$_4$H$_2$ or —PO$_4^\ominus$M$_2^\oplus$,
a=0 to 8
M=Na, K, Li or NH$_4$ and n$_1$=0–25 mole %, preferably 3 to 15 mole %
n$_2$=2–25 mole %, preferably 5 to 15 mole %
n$_3$=10–70 mole %, preferably 15 to 50 mole %
n$_4$=10–60 mole %, preferably 12 to 45 mole %
n$_5$=10–45 mole %, preferably 15 to 30 mole %.

As indicated by the above structural formula, the acid-substituted ternary acetal polymers can be tetramers, in which the recurring unit comprise a vinyl acetate moiety and first, second and third cyclic acetal groups, or pentamers in which the recurring unit comprises a vinyl alcohol moiety, a vinyl acetate moiety and first, second, and third cyclic acetal groups.

All three of the acetal groups are six-membered cyclic acetal groups, one of them is unsubstituted or substituted with an alkyl or hydroxyalkyl group, another is substituted with an aromatic or heterocyclic moiety, and a third is substituted with an acid group, an acid-substituted alkyl group or an acid-substituted aryl group.

The acid-substituted ternary acetal polymers provide lithographic printing plates characterized by improved abrasion-resistance, improved resistance to chemical attack, extended press performance and enhanced roll-up properties in comparison with other acetal polymers. Lithographic printing plates utilizing the acid-substituted ternary acetal polymers as polymeric binders also have the important advantage that they can be processed in aqueous alkaline developing solutions containing very low concentrations of organic solvents. This is highly advantageous in view of the high costs and environmental concerns associated with the use of organic solvents. Since the acid-substituted ternary acetal polymers are fully soluble in aqueous alkaline developing solutions, they avoid the problems encountered with binders that cause the coating to break-up in particulate form.

A particularly preferred binder for use in this invention is the acid-substituted ternary acetal polymer described in Example 1 of U.S. Pat. No. 5,169,898, which is referred to hereinafter as binder ATAP.

In the present invention, the combination of diaryl iodonium salt and an N-aryl, O-aryl or S-aryl polycarboxylic acid gives an excellent combination of high photospeed and long shelf-life and thus represents a preferred embodiment of the invention. The combination of a diphenyliodonium salt and anilinediacetic acid represents a particularly preferred embodiment. An optimum formulation includes the diphenyliodonium salt, the anilinediacetic acid and binder ATAP.

Lithographic printing plates that are capable of being imagewise exposed with ultraviolet- or visible-light-emitting lasers can be prepared by coating the photopolymerizable compositions described herein on a suitable support, and removing the solvent by drying at ambient or elevated temperatures. Any one of a variety of conventional coating techniques can be employed, such as extrusion coating, doctor-blade coating, spray-coating, dip coating, whirl coating, spin coating, roller coating, etc.

Coating compositions can be prepared by dispersing or dissolving the components in any suitable solvent or combination of solvents. The solvents are chosen to be substantially unreactive toward the components and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cyclohexanone; ethers such as tetrahydrofuran and dioxane; 2-methoxyethyl acetate; N,N'-dimethylformamide; chlorinated hydrocarbons such as chloroform, trichloroethane, 1,2-dichloroethane, 1,1-dichloroethane, 1,1,2-trichloroethane, dichloromethane, tetrachloroethane, chlorobenzene; and mixtures thereof.

Suitable supports can be chosen from among a variety of materials which do not directly chemically react with the coating composition. Such supports include fiber-based materials such as paper, polyethylene-coated paper, polypropylene-coated paper, parchment, cloth, etc., sheets and foils of such materials as aluminum, copper, magnesium, zinc, etc.; glass and glass coated with such metals as chromium alloys, steel, silver, gold, platinum, etc.; synthetic resins and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Preferred support materials include zinc, anodized aluminum, grained aluminum, and aluminum which has been grained and anodized.

The support can be preliminarily coated—i.e., before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc; carboxymethyl cellulose, gelatin; polyacrylamide; and similar polymer materials.

The optimum coating thickness of the radiation-sensitive layer will depend upon such factors as the particular application to which the printing plate will be put, and the nature of other components which may be present in the coating. Typical coating thicknesses can be from about 0.05 to about 10.0 microns or greater, with thicknesses of from 0.1 to 2.5 microns being preferred.

Aluminum has been used for many years as a support for lithographic printing plates and is particularly preferred for use with the printing plates of this invention. In order to prepare the aluminum for such use, it is typical to subject it to both a graining process and a subsequent anodizing process. The graining process serves to improve the adhesion of the subsequently applied radiation-sensitive coating and to enhance the water-receptive characteristics of the background areas of the printing plate. The graining affects both the performance and the durability of the printing plate, and the quality of the graining is a critical factor determining the overall quality of the printing plate. A fine, uniform grain that is free of pits is essential to provide the highest quality performance.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,538,683, 4,564,429, 4,582,996, 4,618,405, 4,735,696, 4,897,168 and 4,919,774.

In the manufacture of lithographic printing plates, the graining process is typically followed by an anodizing process, utilizing an acid such as sulfuric or phosphoric acid, and the anodizing process is typically followed by a process which renders the surface hydrophilic such as a process of thermal silication or electrosilication. The anodization step serves to provide an anodic oxide layer and is preferably controlled to create a layer of at least 0.3 g/m$^2$. Processes for anodizing aluminum to form an anodic oxide coating and then hydrophilizing the anodized surface by techniques such as silication are very well known in the art, and need not be further described herein.

Included among the many patents relating to processes for anodization of lithographic printing plates are U.S. Pat. Nos. 2,594,289, 2,703,781, 3,227,639, 3,511,661, 3,804,731, 3,915,811, 3,988,217, 4,022,670, 4,115,211, 4,229,266 and 4,647,346. Illustrative of the many materials useful in forming hydrophilic barrier layers are polyvinyl phosphonic acid, polyacrylic acid, polyacrylamide, silicates, zirconates and titanates. Included among the many patents relating to hydrophilic barrier layers utilized in lithographic printing plates are U.S. Pat. Nos. 2,714,066, 3,181,461, 3,220,832, 3,265,504, 3,276,868, 3,549,365, 4,090,880, 4,153,461, 4,376,914, 4,383,987, 4,399,021, 4,427,765, 4,427,766, 4,448,647, 4,452,674, 4,458,005, 4,492,616, 4,578,156, 4,689,272, 4,935,332 and European Patent No. 190,643.

Radiation-sensitive layers of lithographic printing plates of this invention can contain a variety of optional ingredients such as antioxidants, surfactants, anti-scumming agents, and the like.

The radiation-sensitive layer can contain pigments preferably having a maximum average particle size less than about 3 micrometers. These pigments can provide a visible coloration to an image before or after development of the plate. Useful pigments are well known in the art and include titanium dioxide, zinc oxide, copper phthalocyanines, halogenated copper phthalocyanines, quinacridine, and colorants such as those sold commercially under the trade name Hostaperm. The pigments are generally present in the composition in an amount within the range of from 0 to about 50 percent (by weight) based on the total dry composition weight. Preferred amounts are within the range of from about 5 to about 20 percent (by weight).

The exposed printing plate can be developed by flushing, soaking, swabbing or otherwise treating the radiation-sensitive layer with a solution (hereinafter referred to as a developer) which selectively solubilizes (i.e., removes) the unexposed areas of the radiation-sensitive layer. The developer is preferably an aqueous solution having a pH as near to neutral as is feasible.

In a preferred form, the developer includes a combination of water and an alcohol that is miscible with water, or able to be rendered miscible by the use of cosolvents or surfactants, as a solvent system the proportions of water and alcohol can be varied widely but are typically within the range of from 40 to 99 percent by volume water and from 1 to 60 percent by volume alcohol. Most preferably, the water content is maintained within the range of from 60 to 90 percent by volume. Any alcohol or combination of alcohols that does not chemically adversely attack the radiation-sensitive layer during development and that is miscible with water in the proportions chosen for use can be employed. Exemplary of useful alcohols are glycerol, benzyl alcohol, 2-phenoxy-ethanol, 1,2-propanediol, sec-butyl alcohol and ethers derived from alkylene glycols—i.e., dihydroxy poly (alkylene oxides)—e.g., dihydroxy poly(ethylene oxide), dihydroxy poly(propylene oxide), etc.

It is recognized that the developer can, optionally, contain additional addenda. For example, the developer can contain dyes and/or pigments. It can be advantageous to incorporate into the developer anti-scumming and/or anti-blinding agents as is well recognized in the art.

After development, the printing plate can be treated in any known manner consistent with its intended use. For example, lithographic printing plates are typically subjected to desensitizing etches.

In the photopolymerizable compositions of this invention, the high level of sensitivity, on the order of 0.1 mJ/cm$^2$, is achieved by means of the chemical amplification effects provided by free-radical initiated polymerization of addition-polymerizable ethylenically-unsaturated compounds. The propagation of radical reactions is quenched by oxygen, so it is necessary to provide the photopolymerizable coating with an oxygen barrier.

Thus, the lithographic printing plates of this invention preferably include an oxygen barrier layer overlying the radiation-sensitive layer. This oxygen barrier layer serves to prevent quenching of initiating and propagating radicals involved in the photopolymerization process. Particularly effective oxygen barrier layers are those composed of polyvinyl alcohol.

Polyvinyl alcohols suitable for use as oxygen barrier layers are well known commercially available materials. They preferably have an average molecular weight in the range of from about 3,000 to about 120,000. Examples of suitable polyvinyl alcohols include those available in a range of molecular weights from AIR PRODUCTS CORPORATION under the trademarks AIRVOL 107, AIRVOL 203, AIRVOL 205, AIRVOL 523 and AIRVOL 540. Other suitble polyvinyl alcohols include those available from HOECHST-CELANESE under the trademarks MOWIOL 4-88, MOWIOL 4-98, MOWIOL 5-88, MOWIOL 18-88, MOWIOL 26-88, and MOWIOL 40-88. Preferred polyvinyl alcohols for use in this invention are those that are essentially fully hydrolyzed, for example about 98% hydrolyzed, such as AIRVOL 107 or MOWIOL 4-98. Use of fully hydrolyzed polyvinyl alcohols as an oxygen barrier is preferable to use of partially hydrolyzed polyvinyl alcohols as they provide better protection, and consequently better photospeed, and provide better interlayer adhesion.

To form an effective oxygen barrier layer, the polyvinyl alcohol is preferably coated in an amount of from about 0.5 to about 5 g/m$^2$ and more preferably about 1 to about 3 g/m$^2$.

The lithographic printing plates of this invention are of high sensitivity, such as a sensitivity in the range of from about 50 to about 500 microjoules per square centimeter. They are advantageously designed to have a peak sensitivity at about 488 nanometers to adapt them for exposure with an argon-ion laser or to have a peak sensitivity at about 532 nanometers to adapt them for exposure with a frequency doubled Nd:YAG laser. As hereinabove described, they can be designed to have very high sensitivities at both 488 and 532 nanometers to increase their versatility.

The invention is further illustrated by the following examples of its practice taken in conjunction with the comparative examples which illustrate the improved performance achieved with the polycarboxylic acid co-initiators of this invention. In Comparative Example A, the co-initiator is NPG whereas in Comparative Example B, it is an N-aryl α-amino carboxylic acid obtained by derivatizing NPG with glycidyl methacrylate as described in Arimatsu, U.S. Pat. No. 5,378,579, to give a compound of the formula:

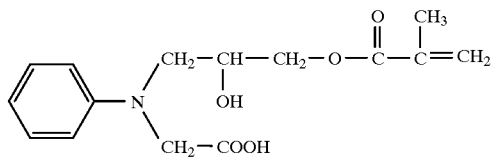

This co-initiator is referred to hereinafter as Co-initiator NPG/GM.

EXAMPLE 1 AND COMPARATIVE EXAMPLES A AND B

A stock solution was prepared by admixing 3.60 parts by weight of a dispersion containing binder ATAP and 20% by weight of the pigment copper phthalocyanine, 21.57 parts by weight of a 10% by weight solution in 1-methoxy-2-propanol of binder ATAP, 2.16 parts by weight of pentaerythritol triacrylate, 0.05 parts by weight of 3,3'-carbonylbis(7-diethylaminocoumarin), 0.22 parts by weight of diphenyliodonium hexafluorophosphate, 14.16 parts by weight of 2-butanone, 23.59 parts by weight of toluene and 34.33 parts by weight of 1-methoxy-2-propanol.

A coating composition, designated Composition 1, was prepared by adding 0.31 parts by weight of anilinediacetic acid to 100 parts by weight of the above-described stock solution. Composition 1 was coated on a grained and anodized aluminum support at a dry coating weight of 1.2 g/m$^2$ to form a lithographic printing plate. The printing plate was then coated with an aqueous solution of 88% hydrolyzed poly(vinyl alcohol) at a dry coating weight of 2.2 g/m$^2$. The printing plate was exposed through a 20-step tablet on an OLEC vacuum frame, heated for 1 minute at 100° C., rinsed with water and developed with the developing composition described in Example 1 of copending commonly assigned U.S. patent application Ser. No. 268,100, filed Jun. 29, 1994, "Aqueous Developer For Lithographic Printing Plates Which Exhibits Reduced Sludge Formation" by Gary R. Miller, John E. Walls and Melanie A. Felker now U.S. Pat. No. 5,466,55, issued Nov. 14, 1995.

A coating composition, designated Composition A was prepared by adding 0.23 parts by weight of NPG to 100 parts by weight of the stock solution. A coating composition, designated Composition B, was prepared by adding 0.44 parts by weight of NPG/GM to 100 parts by weight of the stock solution. The amounts of NPG and NPG/GM employed were selected to provide equimolar comparisons with the anilinediacetic acid used in Composition 1. Compositions A and B were used to prepare lithographic printing plates in the identical manner to Composition 1 and the plates were exposed and processed in the identical manner.

Optical densities of the image of the step tablet were converted into control rating units wherein a difference of 30 units corresponds to a factor of two difference in photospeed. The plates were subjected to accelerated aging at a temperature of 50° C. and the photospeeds were determined at designated intervals. The results obtained are summarized in Table 1 below.

TABLE 1

| | Control Rating Units | | |
| --- | --- | --- | --- |
| Days at 50° C. | Example 1 | Comparative Example A | Comparative Example B |
| 0 | 261 | 300 | 345 |
| 1 | 244 | 253 | 218 |
| 2 | 247 | 236 | 240 |
| 4 | 239 | 227 | 220 |
| 7 | 238 | 198 | 199 |
| 14 | 237 | 163 | 175 |

As shown by the data in Table 1, 14 days of incubation at 50° C. reduced the photospeed of Example 1 by only 1.7 times whereas it reduced the photospeed of Comparative Example A by 23 times and it reduced the photospeed of Comparative Example B by 50 times. Thus, the printing plate of Example 1 exhibits greatly superior shelf-life. While the plates of Comparative Examples A and B have high initial photospeeds, they rapidly lose speed and thus in terms of useful photospeed are greatly inferior.

EXAMPLE 2

A lithographic printing plate similar to that of Example 1 was prepared in which the grained and anodized aluminum support was coated with a radiation-sensitive layer comprising 140 mg/m$^2$ of the copper phthalocyanine pigment dispersion, 410 mg/m$^2$ of binder ATAP, 210 mg/m$^2$ of pentaerythritol triacrylate, 150 mg/m$^2$ of an alkoxylated triacrylate (available from SARTOMER CORPORATION under the trademark SARTOMER 9008), 30 mg/m$^2$ of the bis-(2-hydroxyethylmethacrylate) ester of phosphoric acid (available from CHUGAI BOYEKI CORPORATION under the trademark KAYAMER PM-2 difunctional monomer), 10 mg/m$^2$ of Sensitizer A, 10 mg/m$^2$ of Sensitizer B, 70 mg/m$^2$ of anilinediacetic acid, 50 mg/m$^2$ of diphenyliodonium hexafluorophosphate and 40 mg/m$^2$ of bis-($\eta$5-2,4-cyclopentadienyl-1-yl)bis[2,6-difluoro-3-(1H-pyrrol-1-yl)phenyl]titanium (available from CIBA-GEIGY CORPORATION under the trademark CGI-784). The printing plate was then coated with an aqueous solution of 98% hydrolyzed poly(vinyl alcohol) at a dry coating weight of 2.2 g/m$^2$.

The lithographic printing plate was exposed, processed and evaluated in the manner described in Example 1. The value for initial photospeed, converted into control rating units, was 306, indicating that the plate exhibited high photospeed.

EXAMPLE 3

A lithographic printing plate similar to that of Example 1 was prepared in which the grained and anodized aluminum support was coated with a radiation-sensitive layer comprising 140 mg/m$^2$ of the copper phthalocyanine pigment dispersion, 480 mg/m$^2$ of binder ATAP, 480 mg/m$^2$ of pentaerythritol triacrylate, 10 mg/m$^2$ of Sensitizer A and 69 mg/m$^2$ of anilinediacetic acid. The lithographic printing plate was exposed, processed and evaluated in the manner described in Example 1 and the initial photospeed, converted into control rating units, was determined to be 211.

EXAMPLE 4

A lithographic printing plate was prepared as in Example 3 except that it additionally contained 48 mg/m² of diphenyliodonium hexafluorophosphate. The control rating unit values were 272 for initial photospeed and 246 for photospeed after 14 days at 50° C.; indicating that the addition of an iodonium salt to the composition of Example 3 substantially improved photospeed.

COMPARATIVE EXAMPLE C

A lithographic printing plate was prepared as in Example 3 except that it additionally contained 45 mg/m² of the diazonium salt 4-diazo-3-methoxydiphenylamine hexafluorophosphate. The control rating unit value for initial photospeed was determined to be 115 indicating that the addition of this diazonium salt brought about a major reduction in photospeed of the composition of Example 3.

COMPARATIVE EXAMPLE D

A lithographic printing plate was prepared as in Example 3 except that it additionally contained 59 mg/m² of a mixture of triphenylsulfonium hexafluorophosphate and diphenyl [phenylthiophenyl]-sulfonium hexafluorophosphate (available from Minnesota Mining and Manufacturing Company under the trademark FX-512). The control rating unit value for initial photospeed was determined to be 210 indicating that the addition of this sulfonium salt did not improve the photospeed of the composition of Example 3.

EXAMPLE 5

A lithographic printing plate was prepared as in Example 3 except that it additionally contained 53 mg/m² of 2,4,6-tris(trichloromethyl)-s-triazine. The control rating unit values were 249 for initial photospeed and 233 for photospeed after 14 days at 50° C., indicating that the addition of a triazine to the composition of Example 3 substantially improved photospeed.

EXAMPLE 6

A lithographic printing plate was prepared as in Example 3 except that it additionally contained 33 mg/m² of N-methoxy-4-phenylpyridinium tetrafluoroborate. The control rating unit values were 246 for initial photospeed and 209 for photospeed after 14 days at 50° C. indicating that the addition of an N-alkoxypyridinium salt to the composition of Example 3 substantially improved photospeed.

EXAMPLE 7

A lithographic printing plate was prepared as in Example 3 except that it additionally contained 81 mg/m² of 2,2'-bis(o-chlorophenyl)-4,5,4',5'-tetraphenyl-1,2'-biimidazole. The control rating unit values were 242 for initial photospeed and 192 for photospeed after 14 days at 50° C., indicating that the addition of a hexaarylbisimidazole to the composition of Example 3 substantially improved photospeed.

EXAMPLES 8 AND 9 AND COMPARATIVE EXAMPLES E AND F

Coating compositions as described in Table 2 below were prepared and coated on grained and anodized aluminum supports to form printing plates. The printing plates were exposed, processed and evaluated in the same manner as described in Example 1.

TABLE 2

| | Parts By Weight | | | |
|---|---|---|---|---|
| Component | Example 8 | Example 9 | Comparative Example E | Comparative Example F |
| Copper phthalocyanine dispersion[1] | 2.97 | 2.97 | 2.97 | 2.97 |
| Acetal polymer[2] | 20.82 | 20.82 | 20.82 | 20.82 |
| Pentaerythritoltriacrylate | 2.19 | 2.19 | 2.19 | 2.19 |
| Ethyl Eosin | 0.11 | 0.11 | 0.11 | 0 |
| Diphenyliodonium hexafluorophosphate | 0.21 | 0 | 0.21 | 0 |
| Anilinediacetic acid | 0.26 | 0.26 | 0 | 0.26 |
| 2-Butanone | 13.83 | 13.86 | 13.87 | 13.84 |
| Toluene | 23.05 | 23.10 | 23.11 | 23.07 |
| 1-Methoxy-2-propanol | 36.45 | 36.58 | 36.61 | 36.52 |

[1]A dispersion containing binder ATAP and 20% by weight of copper phthalocyanine.
[2]A 10% by weight solution in 1-methoxy-2-propanol of binder ATAP.

For each of the printing plates, the optical densities of the image of the step tablet were converted into control rating units and the results obtained are summarized in Table 3 below.

TABLE 3

| | Control Rating Units | | | |
|---|---|---|---|---|
| Days at 50° C. | Example 8 | Example 9 | Comparative Example E | Comparative Example F |
| 0 | 162 | 93 | 97 | 0 |
| 1 | 162 | 84 | 98 | 0 |
| 5 | 161 | 86 | 74 | 0 |
| 7 | 161 | 89 | 60 | 0 |
| 14 | 150 | 78 | 71 | 0 |

The results reported in Table 3 indicate that ethyl Eosin, a xanthene dye, is effective as a sensitizer in the present invention. In Example 8 anilinediacetic acid was used as a first co-initiator and diphenyliodonium hexafluorophosphate was used as a second co-initiator and both high photospeed and good shelf-life were obtained. Example 9 differed from Example 8 in that the diphenyliodonium hexafluorophosphate was omitted and as a result the photospeed was significantly lower. Comparative Example E differed from Example 8 in that the anilinediacetic acid was omitted and as a result both photospeed and shelf-life were significantly lower. Comparative Example F differed from Example 8 in that the sensitizer was omitted with the result that no image was obtained under the exposure conditions employed.

The data in Table 3 indicate that both anilinediacetic acid and diphenyliodonium hexafluorophosphate are reasonably effective in meeting the dual objectives of high photospeed and good shelf-life but that when they are used in combination as in Example 8 much better results are achieved.

EXAMPLE 10

A lithographic printing plate similar to that of Example 1 was prepared in which the grained and anodized aluminum support was coated with a radiation-sensitive layer comprising 140 mg/m² of the copper phthalocyanine pigment dispersion, 410 mg/m² binder ATAP, 325 mg/m² of pentaerythritol triacrylate, 150 mg/m² of an alkoxylated triacrylate (available from SARTOMER CORPORATION under the trademark SARTOMER 9008), 25 mg/m² of the bis (2-hydroxyethyl methacrylate ester of phosphoric acid (available from CHUGAI BOYEKI CORPORATION under the trademark KAYAMER PM-2 difunctional monomer), 10 mg/m² of Sensitizer A, 33 mg/m² of N-methoxy-4-phenylpyridinum tetrafluoroborate, 70 mg/m² of anilinediacetic acid and 40 mg/m² of bis($\downarrow^5$-2,4-cyclopentadien-1-yl)bis[2,6-difluoro-3-(1H-pyrrol-1-yl)phenyl]-titanium. The printing plate was then coated with an aqueous solution of 98% hydrolyzed poly(vinyl alcohol) at a dry coating weight of 2.2 g/m².

The lithographic printing plate was exposed, processed and evaluated in the manner described in Example 1. For each sample of the printing plate, the optical densities of the image of the step tablet were converted into control rating units and the results obtained are summarized in Table 4 below.

TABLE 4

| Days at 50° C. | Days at 38° C. 80% Relative Humidity | Control Rating Units |
| --- | --- | --- |
| 0 | — | 273 |
| 3 | — | 257 |
| 7 | — | 259 |
| 14 | — | 260 |
| — | 7 | 257 |

The results reported in Table 4 indicate that the formulation of Example 10 provided both high photospeed and good shelf-life.

EXAMPLE 11

A lithographic printing plate similar to that of Example 10 was prepared in which the 33 mg/m² pf N-methoxy-4-phenylpyridinium tetrafluoroborate was replaced with 36 mg/m² of 1-methoxy-3-(methoxycarbonyl)-pyridinium hexafluorophosphate. The control rating unit value was 271 for the initial photospeed.

EXAMPLE 12

A lithographic printing plate similar to that of Example 10 was prepared in which the 33 mg/m² of N-methoxy-4-phenylpyridinium tetrafluoroborate was replaced with 46 mg/m² of 1-methoxy-3-(2-phenyl-1-ethoxycarbonyl) pyridinium hexafluorophosphate. The control rating unit value was 278 for the initial photospeed.

EXAMPLE 13

A lithographic printing plate similar to that of Example 10 was prepared in which the 33 mg/m² of N-methoxy-4-phenylpyridinum tetrafluoroborate was replaced with 36 mg/m² of 1-methoxy-4-cyanopyridinium tetrafluoroborate. The control rating unit value was 298 for the initial photospeed.

EXAMPLE 14

A lithographic printing plate similar to that of Example 10 was prepared in which the 33 mg/m² of N-methoxy-4-phenylpyridinium tetrafluoroborate was replaced with 30 mg/m² of 1-methoxypyridinium hexafluorophosphate. The control rating unit value was 299 for the initial photospeed.

EXAMPLE 15

A lithographic printing plate similar to that of Example 2 was prepared in which the 70 mg/m² of anilinediacetic acid was replaced with 70 mg/m² of 2-[(carboxymethyl) methylamino]benzoic acid.

The lithographic printing plate was exposed, processed and evaluated in the manner described in Example 1. The values for initial photospeed and photospeed after 14 days at 50° C., converted to control rating units, were 281 and 283, respectively, indicating that the plate exhibited both high photospeed and good shelf-life.

EXAMPLE 16

A lithographic printing plate similar to that of Composition 1 in Example 1 was prepared in which the 0.31 parts by weight of anilinediacetic acid was replaced with an equimolar amount of p-chlorophenyl-iminodiacetic acid.

The lithographic printing plate was exposed, processed and evaluated in the manner described in Example 1. The value for initial photospeed, converted to control rating units, was 268.

EXAMPLE 17

A lithographic printing plate similar to that of Example 2 was prepared in which the 50 mg/m² of diphenyliodonium hexafluorophosphate was replaced with 70 mg/m² of 4-(octyloxyphenyl)phenyliodonium tosylate.

The lithographic printing plate was exposed, processed and evaluated in the manner described in Example 1. The values for initial photospeed and photospeed after 14 days at 50° C., converted to control rating units, were 309 and 287, respectively, indicating that the plate exhibited both high photospeed and good shelf-life.

EXAMPLE 18

A lithographic printing plate similar to that of Composition 1 in Example 1 was prepared in which the pentaerythritol triacrylate was replaced with an equal amount of the reaction product of hexamethylene-diisocyanate with two equivalents of 2-hydroxyethyl methacrylate.

The lithographic printing plate was exposed, processed and evaluated in the manner described in Example 1. The value for initial photospeed, converted to control rating units, was 301.

EXAMPLE 19

A lithographic printing plate was prepared as in Example 3 except that it additionally contained 70 mg/m² of tetramethylammonium n-butyltriphenylborate and 50 mg/m² of 2-(1-naphthalenyl)-4,6-bis(trichloromethyl)-1,3,5-triazine. The control rating unit value was 249 for initial photospeed and 173 after seven days of incubation at 50° C.

EXAMPLE 20

Lithographic printing plates similar to that of Example 1 were prepared in which the grained and anodized aluminum supports were coated to a dry weight of about 1.1 g/m² with the radiation-sensitive formulations described in Table 5 below. Each plate was also coated with an aqueous solution of 98% hydrolyzed poly(vinyl alcohol) at a dry coating weight of 2.2 g/m².

TABLE 5

| Ingredient | A | B | C | D |
|---|---|---|---|---|
| 20% copper phthalocyanine pigment dispersion | 3.33 | 3.33 | 3.33 | 3.33 |
| 10% ternary vinylacetal binder resin | 18.07 | 18.07 | 18.07 | 18.07 |
| pentaerythritol triacrylate | 1.33 | 1.33 | 1.33 | 1.33 |
| SARTOMER 9008 | 0.67 | 0.67 | 0.67 | 0.67 |
| KAYAMER PM-2 | 1.11 | 1.11 | 1.11 | 1.11 |
| 3,3'-Carbonylbis(5,7-dipropoxy-coumarin) | 0.04 | 0.04 | 0.04 | 0.04 |
| co-initiator | 0.00 | 0.33 | 0.35 | 0.31 |
| 2-butanone | 14.29 | 14.24 | 14.24 | 14.25 |
| toluene | 23.82 | 23.74 | 23.74 | 23.75 |
| 1-methoxy-2-propanol | 37.33 | 37.13 | 37.12 | 37.15 |

Control formulation A had no co-initiator, resorcinol-O,O'-diacetic acid was the co-initiator for formulation B, 4-methylcatechol-O,O'-diacetic acid was the co-initiator for formulation C, and 2-(carboxymethylthio)benzoic acid was the co-initiator for formulation D.

Each lithographic printing plate was exposed, processed and evaluated in the manner described in Example 1. The value for the initial photospeeds,. converted into control rating units, is tabulated below.

|  | A | B | C | D |
|---|---|---|---|---|
| Photospeed | 136 | 151 | 143 | 146 |

The above results show that the coatings with the added co-initiator have greater photospeeds than the comparison A lacking any co-initiator.

The invention has been described in detail, with particular reference to certain preferred embodiments thereof, but it should be understood that variations and modifications can be effected within the spirit and scope of the invention.

What is claimed is:

1. A photopolymerizable composition comprising:

(1) at least one addition-polymerizable ethylenically-unsaturated compound, and (2) a photopolymerization initiator system comprising:

(A) a spectral sensitizer that sensitizes in the ultraviolet or visible regions of the spectrum, and (B) a first co-initiator;

wherein said spectral sensitizer is:

[structure of julolidine-based sensitizer with diethylamino styryl ketone]

or

[structure of 3,3'-carbonylbis(7-diethylaminocoumarin)]

or a mixture thereof; and
wherein the first co-initiator is:

[structure: (HOOC—C$_n$H$_{2n}$)$_m$—C$_6$H$_4$—N(R)(CH$_2$—COOH)]

wherein n is an integer of from 1 to 5, m is an integer of from 1 to 5, and R is hydrogen or an alkyl group of 1 to 6 carbon atoms; or

[structure: Q$^1$,Q$^2$-substituted phenyl-N(CH$_2$—COOH)$_2$]

wherein $Q^1$ and $Q^2$ are independently hydrogen or halogen; and wherein said photopolymerizable composition is photo-imagable.

2. The photopolymerizable composition of claim 1 in which the initiator system additionally comprises a second co-initiator selected from the group consisting of iodonium salts, titanocenes, haloalkyl-substituted s-triazines, hexaaryl bisimidazoles, alkyltriarylborate salts and photooxidants containing a heterocyclic nitrogen atom that is substituted by either an alkoxy group or an acyloxy group.

3. The photopolymerizable composition of claim 2 in which the a second co-initiator is a diaryl iodonium salt.

4. The photopolymerizable composition of claim 1 in which the first co-initiator is selected from the group consisting of anilinediacetic acid, p-chlorophenyl-iminodiacetic acid, and 2-((carboxymethyl)methylamino)benzoic acid.

5. The photopolymerizable composition of claim 4 in which the initiator system additionally comprises a second co-initiator selected from the group consisting of iodonium salts, titanocenes, haloalkyl-substituted s-triazines, hexaaryl bisimidazoles, alkyltriarylborate salts and photooxidants containing a heterocyclic nitrogen atom that is substituted by either an alkoxy group or an acyloxy group.

6. The photopolymerizable composition of claim 5 in which the first co-initiator is anilinediacetic acid.

7. The photopolymerizable composition of claim 6 in which the a second co-initiator is a diaryl iodonium salt.

8. The photopolymerizable composition of claim 7 in which the addition-polymerizable ethylenically-unsaturated compound is a polyfunctional acrylic monomer.

9. A photopolymerizable composition comprising:

(1) at least one addition-polymerizable ethylenically-unsaturated compound, and (2) a photopolymerization initiator system comprising:

(A) a spectral sensitizer that sensitizes in the ultraviolet or visible regions of the spectrum, the spectral sensitizer being a coumarin, fluorescein, fluorone, xanthene, merocyanine, thioxanthone or isoalloxanine compound, and (B) a first co-initiator, wherein the first co-initiator is:

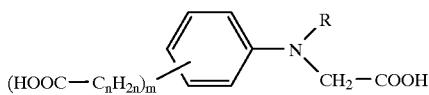

wherein n is an integer of from 1 to 5, m is an integer of from 1 to 5, and R is hydrogen or an alkyl group of 1 to 6 carbon atoms; or

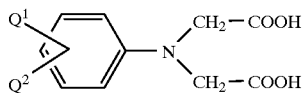

wherein $Q^1$ and $Q^2$ are independently hydrogen or halogen; and wherein said photopolymerizable composition is photoimagable.

10. The photopolymerizable composition of claim 9 in which the first co-initiator is selected from the group consisting of anilinediacetic acid, p-chlorophenyl-iminodiacetic acid, and 2-((carboxymethyl)methylamino)benzoic acid.

11. The photopolymerizable composition of claim 9 in which the first co-initiator is anilinediacetic acid.

12. The photopolymerizable composition of claim 9 in which the initiator system additionally comprises a second co-initiator selected from the group consisting of iodonium salts, titanocenes, haloalkyl-substituted s-triazines, hexaaryl bisimidazoles, alkyltriarylborate salts and photooxidants containing a heterocyclic nitrogen atom that is substituted by either an alkoxy group or an acyloxy group.

13. The photopolymerizable composition of claim 12 in which the first co-initiator is anilinediacetic acid.

14. The photopolymerizable composition of claim 13 in which the second co-initiator is a diaryl iodonium salt.

15. The photopolymerizable composition of claim 14 in which the spectral sensitizer is a 3-substituted coumarin.

16. The photopolymerizable composition of claim 13 in which the addition-polymerizable ethylenically-unsaturated compound is a polyfunctional acrylic monomer.

17. The photopolymerizable composition of claim 16 additionally comprising a film-forming polymeric binder.

18. The photopolymerizable composition of claim 17 in which the second co-initiator is a diaryl iodonium salt and in which the spectral sensitizer is a 3-substituted coumarin.

19. The photopolymerizable composition of claim 17 in which the second co-initiator is an N-alkyoxypyridinum salt.

20. The photopolymerizable composition of claim 19 in which the spectral sensitizer is a 3-substituted coumarin.

21. The photopolymerizable composition of claim 12 in which the composition exhibits superior shelf life to compositions containing N-phenylglycine as the first co-initiator.

22. The photopolymerizable composition of claim 21 in which the first co-initiator is anilinediacetic acid.

* * * * *